United States Patent
Song et al.

(10) Patent No.: US 8,122,331 B1
(45) Date of Patent: Feb. 21, 2012

(54) MEDIA DEFECT COMPENSATION SYSTEM AND METHOD

(75) Inventors: Hongwei Song, Longmont, CO (US);
Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 1216 days.

(21) Appl. No.: 11/836,641

(22) Filed: Aug. 9, 2007

Related U.S. Application Data

(60) Provisional application No. 60/823,189, filed on Aug. 22, 2006.

(51) Int. Cl.
*H03M 13/03* (2006.01)
(52) U.S. Cl. ...................................................... 714/795
(58) Field of Classification Search .................. 714/746, 714/792, 794, 795; 360/48, 53; 369/44.32, 369/47.14, 53.35
See application file for complete search history.

(56) References Cited

U.S. PATENT DOCUMENTS

| | | | |
|---|---|---|---|
| 5,761,171 A * | 6/1998 | Tobita | 369/59.18 |
| 5,926,490 A * | 7/1999 | Reed et al. | 714/787 |
| 6,192,502 B1 * | 2/2001 | Yamaguchi et al. | 714/795 |
| 6,446,236 B1 * | 9/2002 | McEwen et al. | 714/795 |
| 7,173,783 B1 * | 2/2007 | McEwen et al. | 360/46 |
| 7,782,723 B2 * | 8/2010 | El Husseini et al. | 369/44.32 |

* cited by examiner

*Primary Examiner* — Shelly A Chase

(57) ABSTRACT

A system and method of media defect compensation incorporate an architecture capable of modifying a signal representative of data reproduced from a recording medium to compensate for defects in the medium. In accordance with one aspect of the invention, a media defect compensator may incorporate one or two data detectors cooperating with a defect detector to compensate for signal loss due to media defects.

38 Claims, 2 Drawing Sheets

MEDIA DEFECT COMPENSATION SYSTEM AND METHOD

CROSS-REFERENCE TO RELATED APPLICATIONS

The present application claims the benefit of co-pending U.S. provisional application Ser. No. 60/823,189, filed Aug. 22, 2006, entitled "MEDIA DEFECT COMPENSATOR", the disclosure of which is incorporated herein by reference in its entirety.

BACKGROUND

1. Field of the Invention

Aspects of the present invention relate generally to identifying signal loss caused by defective areas in recording media, and more particularly to a media defect compensation system and method that modify a signal to compensate for signal loss due to media defects.

2. Description of Related Art

Recording media (e.g., those employed in conjunction with electronic devices) typically have one or more defects. "Defects" in this context may be caused by inefficiencies or inaccuracies associated with manufacturing processes, impact damage (e.g., scratches) or surface smudges caused by mishandling, particulate contamination, and other factors. Irrespective of the source, such defects tend to cause variations in signals reproduced from the recording medium; for example, defects can result in weak signals, a baseline shift in the reproduced signal, or a total loss of signal when a reading device tries to read data from a defective location on a recording medium.

Defect detectors can generally determine the location of a defective portion of the recording medium, and can additionally identify amplitude variations or baseline shifts of a signal associated with defective areas. However, conventional media defect detectors cannot correct for detected defects. While these defect detectors can identify the existence of a defect at a particular location, and may instruct a device to re-try reading the medium, traditional detectors, and the system architectures in which they are employed, generally provide no mechanism to compensate for signal loss or other variations caused by the defect.

It may be desirable to provide a system and method that are capable of adjusting or modifying a signal reproduced from a recording medium to compensate for deleterious effects on signal quality caused by detected defects in the medium.

SUMMARY

Embodiments of the present invention overcome the above-mentioned and various other shortcomings of conventional technology, providing a system and method of media defect compensation that incorporate an architecture capable of modifying a signal to compensate for media defects. In accordance with one non-limiting aspect of the invention, a media defect compensator may incorporate dual data detectors to compensate for signal loss due to media defects.

The foregoing and other aspects of various embodiments of the present invention will be apparent through examination of the following detailed description thereof in conjunction with the accompanying drawing figures.

BRIEF DESCRIPTION OF THE DRAWING FIGURES

DETAILED DESCRIPTION

Introduction

Figure 1:
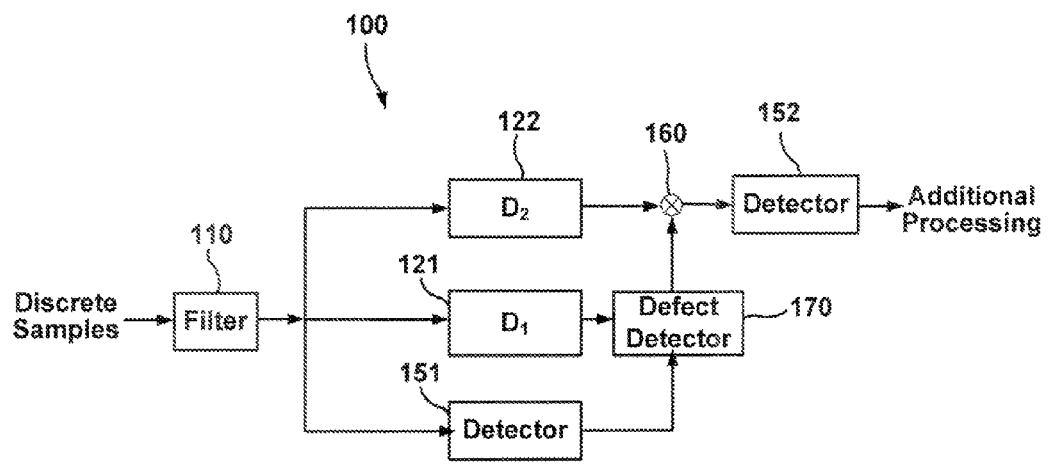
FIG. 1 is a simplified block diagram illustrating one embodiment of a media defect compensator.
Figure 2:
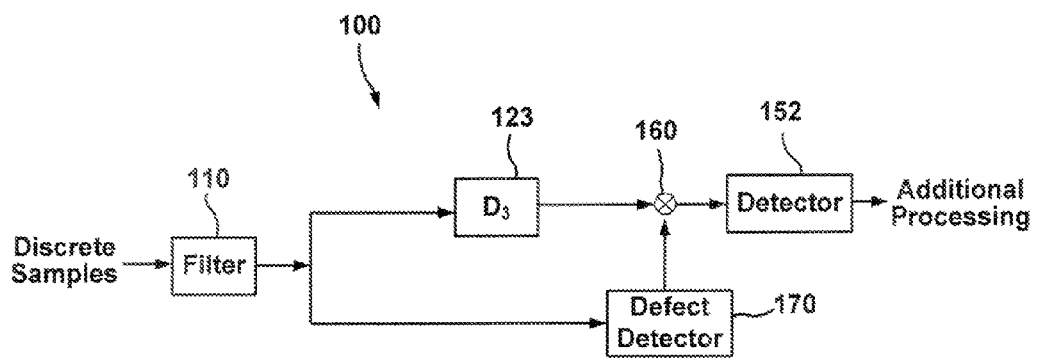
FIG. 2 is a simplified block diagram illustrating another embodiment of a media defect compensator.

Turning now to the drawing figures, FIGS. 1 and 2 are simplified block diagrams illustrating embodiments of a media defect compensator. It will be appreciated that a recording medium may be embodied in or otherwise employ various technologies generally known in the art or developed and operative in accordance with known principles. Many devices incorporate or have read access to magnetic media (such as employed in tape or disk drives), optical media (such as employed in compact disk (CD) or digital versatile disk (DVD) formats), solid state media (such as employed in various types of random access memory (RAM) and read only memory (ROM) chips), or a combination of these and other types of media or electronic hardware operative to store digital data.

A defect compensator 100 such as illustrated in FIGS. 1 and 2 may be integrated with, or otherwise employed in conjunction with, an electronic recording media reader device (not shown in the drawing figures). The specific structure and operation of such readers may generally be influenced by the type of media sought to be read; various types of mechanical, electro-mechanical, electro-optical, and other components may be employed as a function of media type or capacity, physical size constraints, and other factors. In general, various types of readers may be designed and operative to read data from a recording medium, to provide suitable analog to digital conversion (ADC) where necessary, and to provide discrete samples representing digital data stored on the medium. Typically, these samples are provided to a filter or other component that may improve the signal to noise ratio, for example, or otherwise provide a more accurate representation of the data stream reproduced from the medium. The present disclosure is not intended to be limited to any specific recording technologies and media, or to any particular structural arrangement or operational characteristics of the media reader in conjunction with which defect compensator 100 is employed.

As illustrated in the drawing figures, discrete samples from a media reader may be received at a filter 110. Filter 110 may be operative to equalize the samples in the data stream. As is generally known, such equalization may minimize or eliminate intersymbol interference associated with the full channel sample signal. In some embodiments, filter 110 may comprise or employ a finite impulse response (FIR) component. In operation, filter 110 may enable data detectors (discussed below) to operate in accordance with fewer states than might otherwise be required or desirable if the full channel response (e.g., with unfiltered intersymbol interference) were employed.

With reference now to FIG. 1, output from filter 110 may be provided to a data detector 151 and to two delay elements, reference numerals 121 and 122, respectively. Delay elements 121 and 122 may be employed to synchronize receipt of output from filter 110 at other components as set forth in more detail below. In that regard, respective delays (e.g., $D_1$ and $D_2$) for delay elements 121 and 122 may differ in accordance with signal processing capabilities and computational or other operations conducted at other components.

Detector 151 may be employed to receive output from filter 110 and to identify a bit stream that is predicted to be an accurate representation of the data, i.e., the specific sequence of binary numbers that represent actual data read from the recording medium, as opposed to noise, intersymbol interference, distortion, or other anomalies in the signal caused, for example, by modulation, compression, or other factors. Several types of data detectors are generally known in the art as having utility in digital signal processing; these may be implemented in accordance with the particular modulation scheme employed for the signal, for example, or as a function of numerous other factors such as compression algorithms, data throughput rates, convolutional codes, and the like.

Though its implementation and general operation may depend upon the media reader with which it is to be used, detector 151 may be embodied in or comprise a so-called trellis detector, for example, or other type of detector capable of decoding a bit stream encoded with a convolutional code. In some implementations, detector 151 comprises a viterbi detector capable of performing a maximum likelihood estimation regarding the probable location of symbols in the data stream. As noted above, suitable embodiments of detector 151 are generally known in the art; the present disclosure is not intended to be limited to any particular data detection technology, coding strategy, or algorithm.

In operation, output from detector 151 generally comprises a binary sequence that is an estimation or prediction of an accurate representation of the data actually stored on and reproduced from the recording medium. Depending upon the sophistication of detector 151 and other factors, for example, detector 151 may additionally or alternatively provide further output, which may include an analysis or rating associated with the nature or quality of the data stream, an analysis of the quality of the estimation, or some other quality metric that may have utility in defect detection as set forth below.

A media defect detector 170 may receive output from detector 151. As illustrated in FIG. 1, defect detector 170 may also receive output from filter 110 suitably delayed for synchronization with output from detector 151. The specific duration (e.g., $D_1$) provided by delay element 121 may be selected in accordance with operative characteristics of detector 151, the overall data throughput requirements of compensator 100, and other factors.

As is generally known in the art, defect detector 170 may employ both output from filter 110 as well as output from detector 151 to identify defective areas of the recording medium from which data were read. Defect detector 170 may by configured to employ various types of technologies depending upon, for example, the nature of the signal provided by the media reader, the functionality and operational characteristics of detector 151, or a combination of these and other factors.

In operation, and generally based upon a comparison of its several inputs, defect detector 170 may determine the location of a defect in the recording medium; additionally, defect detector 170 may determine the magnitude of signal loss or gain variation associated with such a defect. Additionally or alternatively, defect detector 170 may determine a baseline shift in a signal that is read from a defective portion of the recording medium. Defect detector 170 may employ this information to compute a compensation signal suitable to compensate for signal loss.

In accordance with the architecture illustrated in FIGS. 1 and 2, defect detector 170 may output a compensation signal (which may include a scaling factor, for example) that is operative to compensate for, or to rectify, in whole or in part, signal loss or other variations due to defective portions of recording media. In the illustrated embodiments, a scaling factor output from defect detector 170 may be synchronized with output from filter 110 by an appropriate delay (e.g., $D_2$, provided by delay element 122 in FIG. 1, or $D_3$, provided by delay element 123 in FIG. 2). As noted with respect to operation of delay element 121, the specific delay duration provided by delay elements 122 and 123 may be selected in accordance with operative characteristics of defect detector 170 or other components, the overall data throughput requirements of compensator 100, or a combination of these and other factors.

A multiplier 160 may be employed to scale output from filter 110 in accordance with input received from defect detector 170, modifying the signal to compensate or otherwise account for detected defects. For example, where signal gain is attenuated by 50% at the location of a particular defect, the compensation signal output from defect detector 170 may include a scaling factor to multiply the signal magnitude by a factor of two at the location in the bit stream corresponding to data read from the defective area, compensating for the signal loss. Similarly, where signal gain is only 25% of what is expected, a scaling factor in the compensation signal may multiply signal magnitude by a factor of four at that location. In areas where no defect exists, the scaling factor may be equal to 1. In the foregoing manner, degradation of signal quality or amplitude caused by recording media defects may effectively be minimized or eliminated.

In the foregoing example, a signal including a defect may generally be modeled as the expected signal multiplied by a defect factor; as set forth above, appropriate amplitude compensation may be achieved by multiplying the signal by a scaling factor suitable to cancel or otherwise to account for the defect factor. Where a defect in the recording medium causes a baseline shift, a signal including a defect may generally be modeled as the expected signal plus a baseline shift. In this case, appropriate compensation may be achieved by adding a shift factor to the signal; it will be appreciated that the shift factor may be either positive or negative, depending upon the nature of the baseline shift. In embodiments accommodating such baseline shift corrections, the compensation signal output from defect detector 170 may comprise such a shift factor, and multiplier 160 may be replaced by, or used in conjunction with, an adder (not shown in FIGS. 1 and 2).

Output from multiplier 160 may be provided to a second data detector 152 for additional processing. As noted above, multiplier 160 may be replaced by an adder in some embodiments. As with detector 151, it will be appreciated that detector 152 may be characterized by a trellis detector or other component capable of decoding an encoded bit stream as desired or as required by downstream system components. In some implementations, detector 152 may be embodied in or comprise a non-linear viterbi (NLV) detector, particularly where a maximum likelihood estimation regarding the probable location of symbols in the data stream is required or desired. As indicated in the drawing figures, output from detector 152 may be provided to additional components for additional processing, storage or other manipulation, display, and the like.

With reference now to FIG. 2, it will be appreciated that overall operation of compensator 100 may be similar to that described above with reference to FIG. 1, though the FIG. 2 architecture is simplified by removal of optional detector 151 and optional delay element 121. In the FIG. 2 configuration, defect detector 170 may receive output from filter 110 without interposition of a delay element; with the illustrated architecture, operation of defect detector 170 may be modified from that described above, since defect detector 170 does not receive output from a data detector.

As noted above with reference to FIG. 1, various embodiments of defect detector 170 are generally known, some of which may exclusively employ output from filter 110 to identify defective areas of a recording medium. Defect detector 170 may be configured to employ various types of technologies to determine the location of a defect in the recording medium and to identify the magnitude of signal amplitude variation or baseline shift associated with such a defect. A compensation signal output from defect detector 170 may include a scaling factor, a shift factor, or a combination of both, computed to compensate for signal loss substantially as set forth above.

In the FIG. 2 implementation, output from defect detector 170 may be synchronized with output from filter 110 by an appropriate delay $D_3$ at delay element 123. In the FIG. 2 arrangement, operation of filter 110, multiplier 160, and detector 152 may be executed substantially as set forth above; as noted above with respect to the FIG. 1 architecture, an adder may be employed in embodiments configured to compensate for baseline shift.

Figure 3:
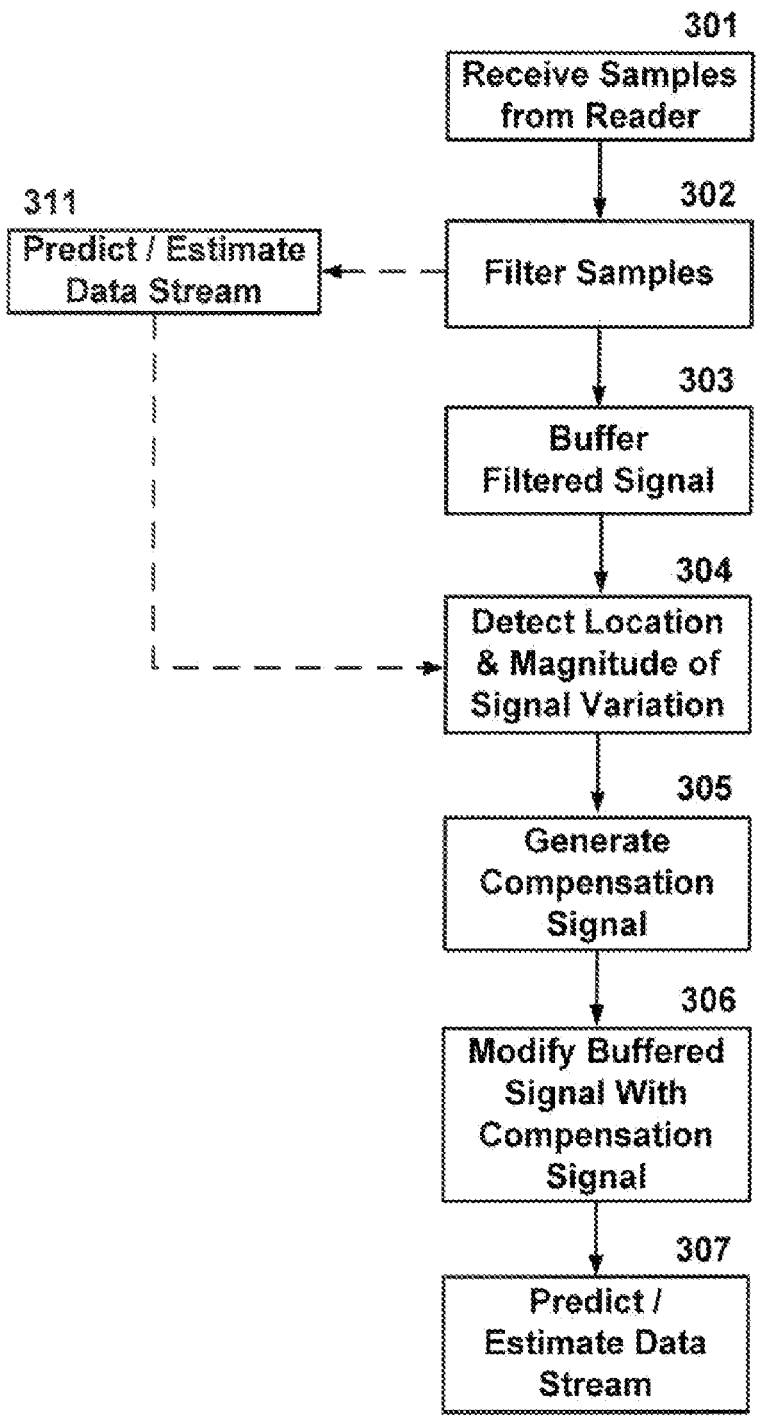
FIG. 3 is a simplified flow diagram illustrating one embodiment of a method of compensating for detected defects in a recording medium.

FIG. 3 is a simplified flow diagram illustrating one embodiment of a method of compensating for detected defects in a recording medium. As indicated at block 301, such a method may begin by receiving discrete samples from a recording media reader device. The signal received may depend upon the type of media reader and may be filtered or otherwise manipulated by the reader, prior to reception by a defect compensator such as illustrated in FIGS. 1 and 2.

The received bit stream may be filtered as indicated at block 302. As noted above, it may be useful to employ an FIR filter so as to minimize or otherwise to reduce the intersymbol interference in the full channel signal as well as to limit the number of possible states that data detectors are required to analyze in order to identify symbol locations in the bit stream. The filter output may be buffered (block 303) one or more times as desired to provide appropriate timing of signal reception at various system components.

The locations of media defects may be identified, and the magnitudes of associated signal amplitude variations, baseline shifts, or other degradation may be determined, as indicated at block 304. These detections may employ a defect detector substantially as set forth above, using any of various known methods. In some embodiments, the defect detector may employ predictive or estimation information or signals output from a data detector (such as a trellis or viterbi detector, for example); in this case, the operation at block 304 may utilize an estimated data stream, a quality metric, or both, provided by the data detector as indicated by the dashed arrows to and from block 311.

A compensation signal may be generated as indicated at block 305. Generally, the compensation signal may be indicative of signal amplitude loss, baseline shift, or both, due to a defect. Where the location of a defect and the associated variation in signal output are known, the compensation signal may be operative to modify the buffered output from the filter in order to compensate for this signal loss or degradation (block 306). In some embodiments, the compensation signal may include a scaling factor that is employed (e.g., in a multiplier) to amplify or otherwise appropriately to scale the buffered filter output at points in the data stream corresponding to areas of the recording medium at which defects were detected. Those of skill in the art will appreciate that the modification of the buffered signal illustrated at block 306 is susceptible of numerous variations, and that the present disclosure is not intended to be limited to a compensation signal that employs scaling factors exclusively. For example, in embodiments capable of compensating for baseline shift, the compensation signal may include a shift factor that is employed (e.g., in an adder) to modify the buffered filter output.

As set forth above, the compensation signal may be generated by a conventional defect detector suitably modified to output relevant information. Alternatively, a traditional defect detector may output location and signal variation information to a different circuit or device that uses such information to generate a compensation signal appropriate for the data stream provided by the filter.

A predicted or estimated data stream may be provided as indicated at block 307. As set forth above, the filter output, modified in accordance with the compensation signal, may be provided to a data detector or other component operative to predict the location of symbols in the data stream. A non-linear viterbi detector, for example, may provide results that accurately reflect the data reproduced from the recording medium.

The arrangement of the blocks in FIG. 3 does not necessarily imply a particular order or sequence of events, nor is it intended to exclude other possibilities. For example, where appropriate or sufficient filtering is performed by the media reader itself, the filtering operation depicted at block 302 may be redundant or unnecessary; in such instances, compensator 100 illustrated in FIGS. 1 and 2 may be configured not to include filter 110. Similarly, buffering at block 303 may be unnecessary in instances where the reader is configured to provide multiple outputs, one or more of which are delayed by a suitable duration. Additionally or alternatively, the operations depicted at blocks 304 and 305 may be combined, for example, and executed substantially concomitantly by a suitably capable defect detector as set forth above.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. Therefore, it is intended that the invention be considered as limited only by the scope of the appended claims.

What is claimed is:

1. A media defect compensator comprising:
   a first data detector to receive an output from a filter, the output representing data reproduced from a recording medium;
   a media defect detector to
      receive the output from the filter and an output from the first data detector, and
      provide a compensation signal indicative of a signal variation in the output from the filter due to a defect in the recording medium; and
   a second data detector to receive a signal comprising the output from the filter modified by the compensation signal.

2. The media defect compensator of claim 1, wherein the output of the first data detector is a signal representative of a location of symbols in the output from the filter.

3. The media defect compensator of claim 1, wherein the first data detector is a trellis detector.

4. The media defect compensator of claim 3, wherein the first data detector is a viterbi detector.

5. The media defect compensator of claim 1, wherein the second data detector is a trellis detector.

6. The media defect compensator of claim 5, wherein the second data detector is a viterbi detector.

7. The media defect compensator of claim 1, wherein the filter comprises a finite impulse response component.

8. The media defect compensator of claim 7, wherein the finite impulse response component reduces intersymbol interference in the output representing data reproduced from the recording medium.

9. The media defect compensator of claim 1, wherein the signal variation is an amplitude variation, and wherein the compensation signal comprises a scaling factor.

10. The media defect compensator of claim 9, further comprising a multiplier to multiply the output from the filter by the scaling factor.

11. The media defect compensator of claim 10, further comprising a buffer to synchronize, at the multiplier, reception of i) the output from the filter and ii) the compensation signal.

12. The media defect compensator of claim 1, wherein the signal variation is a baseline shift, and wherein the compensation signal comprises a shift factor.

13. The media defect compensator of claim 12, further comprising an adder to add the shift factor to the output from the filter.

14. The media defect compensator of claim 13, further comprising a buffer to synchronize, at the adder, reception of i) the output from the filter and ii) the compensation signal.

15. A method of compensating for a defect in a recording medium, the method comprising:
   receiving a signal representative of data reproduced from a recording medium;
   identifying i) a location of a defect in the recording medium and ii) a signal variation in the signal due to the defect;
   generating a compensation signal responsive to the identifying;
   modifying the signal in accordance with the compensation signal; and
   buffering the signal prior to the modifying.

16. The method of claim 15, wherein the signal variation is an amplitude variation, and wherein the compensation signal comprises a scaling factor.

17. The method of claim 16, wherein the modifying comprises multiplying the signal by the scaling factor.

18. The method of claim 15, wherein the signal variation is a baseline shift, and wherein the compensation signal comprises a shift factor.

19. The method of claim 18, wherein the modifying comprises adding the shift factor to the signal.

20. The method of claim 15, wherein the identifying comprises utilizing an output from a data detector.

21. The method of claim 20, wherein the output from the data detector comprises a quality metric associated with the output.

22. The method of claim 15, further comprising, responsive to the modifying, executing a maximum likelihood estimation regarding a probable location of symbols in a modified signal.

23. The method of claim 22, wherein the executing comprises utilizing a trellis detector.

24. The method of claim 15, further comprising filtering the signal prior to the identifying.

25. The method of claim 24, wherein the filtering comprises utilizing a finite impulse response component.

26. A media defect compensator comprising:
   a media defect detector to receive a signal representative of data reproduced from a recording medium, and to output a compensation signal indicative of a signal variation in the received signal due to a defect in the recording medium;
   a data detector to receive a modified signal comprising the received signal modified by the compensation signal; and
   an additional data detector to provide an estimation regarding the received signal to the media defect detector.

27. The media defect compensator of claim 26, wherein the signal variation is an amplitude variation, and wherein the compensation signal comprises a scaling factor.

28. The media defect compensator of claim 27, further comprising a multiplier to multiply the received signal by the scaling factor.

29. The media defect compensator of claim 28, further comprising a buffer to synchronize, at the multiplier, reception of i) the received signal and ii) the compensation signal.

30. The media defect compensator of claim 26, wherein the signal variation is a baseline shift, and wherein the compensation signal comprises a shift factor.

31. The media defect compensator of claim 30, further comprising an adder to add the shift factor to the received signal.

32. The media defect compensator of claim 31, further comprising a buffer to synchronize, at the adder, reception of i) the received signal and ii) the compensation signal.

33. The media defect compensator of claim 26, wherein the data detector is a trellis detector.

34. The media defect compensator of claim 33, wherein the data detector is a viterbi detector.

35. The media defect compensator of claim 34, wherein the viterbi detector executes a maximum likelihood estimation regarding a probable location of symbols in the modified signal.

36. The media defect compensator of claim 26, wherein the additional data detector provides a quality metric associated with the estimation to the media defect detector.

37. The media defect compensator of claim 26, wherein the additional data detector is a trellis detector.

38. The media defect compensator of claim 37, wherein the additional data detector is a viterbi detector.

* * * * *